United States Patent
Xiong et al.

(10) Patent No.: US 10,447,302 B2
(45) Date of Patent: Oct. 15, 2019

(54) MEMORY SYSTEM DECODING DESIGN AND OPERATING METHOD THEREOF

(71) Applicant: SK hynix Inc., Gyeonggi-do (KR)

(72) Inventors: Chenrong Xiong, San Jose, CA (US); Fan Zhang, Fremont, CA (US); Yu Cai, San Jose, CA (US); Aman Bhatia, San Jose, CA (US); Naveen Kumar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 25 days.

(21) Appl. No.: 15/714,715

(22) Filed: Sep. 25, 2017

(65) Prior Publication Data

US 2019/0097652 A1   Mar. 28, 2019

(51) Int. Cl.
  *H03M 13/11*   (2006.01)
  *G11C 29/52*   (2006.01)
  *G06F 11/10*   (2006.01)

(52) U.S. Cl.
  CPC ..... *H03M 13/1108* (2013.01); *G06F 11/1048* (2013.01); *G06F 11/1068* (2013.01); *G11C 29/52* (2013.01); *H03M 13/1148* (2013.01)

(58) Field of Classification Search
  CPC ........... H03M 13/116; H03M 13/1108; H03M 13/1148; H03M 13/353; G06F 11/1068; G06F 11/1072
  See application file for complete search history.

(56) References Cited

U.S. PATENT DOCUMENTS

| | | | |
|---|---|---|---|
| 2016/0179620 A1* | 6/2016 | Bazarsky | H03M 13/116 714/766 |
| 2017/0255512 A1* | 9/2017 | Zamir | H03M 13/353 |
| 2018/0034477 A1* | 2/2018 | Zamir | G11C 16/08 |

* cited by examiner

*Primary Examiner* — Shelly A Chase
(74) *Attorney, Agent, or Firm* — IP & T Group LLP

(57) ABSTRACT

A semiconductor memory system and an operating method thereof include a plurality of memory devices; and a controller coupled with the memory devices and configured to perform a decoding process to collect at least an output vector associated with an input bit vector, wherein the input bit vector corresponds to a plurality of variable nodes; divide the plurality of variable nodes into a plurality of groups; calculate syndrome of the output vector; and update flipping threshold and flipping indicator of each of the plurality of variable nodes.

20 Claims, 5 Drawing Sheets

MEMORY SYSTEM DECODING DESIGN AND OPERATING METHOD THEREOF

BACKGROUND

Field of Invention

Exemplary embodiments of the present invention relate to an apparatus of semiconductor memory storage system, and more particularly to LDPC code decoding and an operating method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include flash memory components and a SSD controller. The SSD controller can be also referred as a processor, which includes the electronics that bridge the flash memory components to the SSD input/output (I/O) interfaces. The SSD controller can include an embedded processor that can execute functional components, such as firmware. The SSD functional components are device specific, and in most cases, can be updated.

The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NOR-type flash allows a single machine word (byte) to be written to an erased location or read independently. The NAND-type operates primarily in memory cards, USB flash drives, solid-state drives, and similar products, for general storage and transfer of data.

NAND flash-based storage devices have been widely adopted because of their faster read/write performance, lower power consumption, and shock proof features. One drawback is their relatively higher price as compared to hard disk drives (HDD). In order to bring costs down, NAND flash manufacturers have been pushing the limits of their fabrication processes towards 20 nm and lower, which often leads to a shorter usable lifespan and a decrease in data reliability. As such, a much more powerful error correction code (ECC) is required over traditional BCH codes to overcome the associated noises and the interferences, and therefore improve the data integrity. One such ECC is low-density parity-check (LDPC) code. Various algorithms can be utilized for decoding LDPC codes more accurate and faster.

Thus, there remains a need for a semiconductor memory system and operating method thereof for a LDPC code decoding. In view of the ever-increasing need to improve performance and security, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

In accordance with an embodiment of the present invention, there is provided with a semiconductor memory system which includes a plurality of memory devices; and a controller coupled with the memory devices and configured to perform a decoding process to collect at least an output vector associated with an input bit vector, wherein the input bit vector corresponds to a plurality of variable nodes; divide the plurality of variable nodes into a plurality of groups; calculate syndrome of the output vector; and update flipping threshold and flipping indicator of each of the plurality of variable nodes.

In accordance with an embodiment of the present invention, there is provided with an operating method of a semiconductor memory system which includes performing a decoding process including collecting at least an output vector associated with an input bit vector, wherein the input bit vector corresponds to a plurality of variable nodes; dividing the plurality of variable nodes into a plurality of groups; calculating syndrome of the output vector; and updating flipping threshold and flipping indicator of each of the plurality of variable nodes.

DETAILED DESCRIPTION

Figure 1:
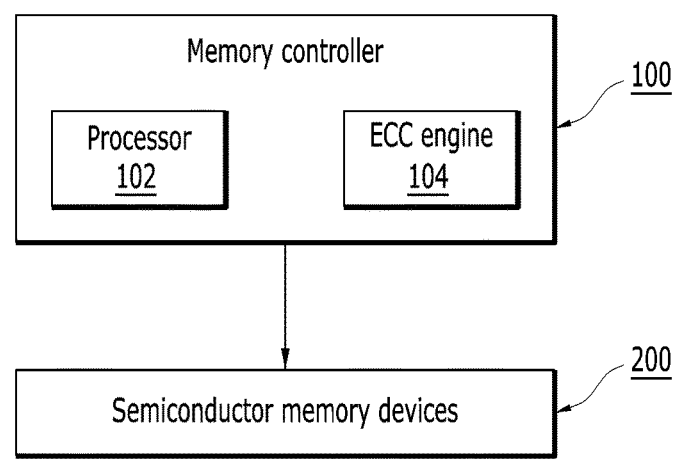
FIG. 1 is a top-level block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In a memory system, a powerful error correction code (ECC) is required to overcome associated noises and interferences, and therefore improve data integrity. One such ECC is low-density parity-check (LDPC) code. In embodiments of present invention, a bit-flipping LDPC decoding apparatus and method can be utilized for decoding LDPC codes, such as irregular LDPC codes, more accurate and faster.

Low-density parity-check (LDPC) codes are a family of linear block forward error-correction code (ECC) whose parity check matrix can be represented by a low-density parity-check (LDPC) matrix. The LDPC code can be constructed allowing a noise threshold to be set very close to the theoretical maximum for a symmetric memoryless channel, thus, can be utilized for transmitting a message over a noisy transmission channel. The noise threshold can define an upper bound for channel noise, up to the probability of lost information can be made as small as desired.

The LDPC codes can be found in increasing use of applications requiring reliable and highly efficient information transfer over bandwidth or return channel-constrained links in the presence of corrupting noise. The LDPC codes can be decoded in time linear to block length thereof, and can provide excellent error-correction performance.

Referring now to FIG. 1, therein is shown a top-level block diagram schematically illustrating a memory system in accordance with an embodiment of the present invention. The memory system can include numerous components including a memory controller 100, and semiconductor memory devices 200, such as flash memory devices. The memory controller 100 can comprise a processor 102 for executing programs and instructions stored in the memory system for operating the memory system.

The memory controller 100 may control overall operations of the semiconductor memory devices 200, via a communication input/output (I/O) bus 104 comprises command CMD, address ADDR, data DATA, power PWR, and a control signal CTRL. The control signal CTRL may include a command latch enable (CLE) signal, an address latch enable (ALE) signal, a chip enable (CE) signal, a write enable (WE) signal, a read enable (RE) signal, and so on.

The semiconductor memory devices 200 may perform one or more erase, program, write, and read operations under the control of the memory controller 100. The semiconductor memory devices 200 may receive the command, address, and data through input/output lines from the memory controller 100. The semiconductor memory devices 200 may receive the power PWR through a power line and the control signal CTRL through a control line.

The memory controller 100 and the semiconductor memory devices 200 may be integrated in a single semiconductor device such as the SSD or a memory card. For example, the memory controller 100 and the semiconductor memory devices 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
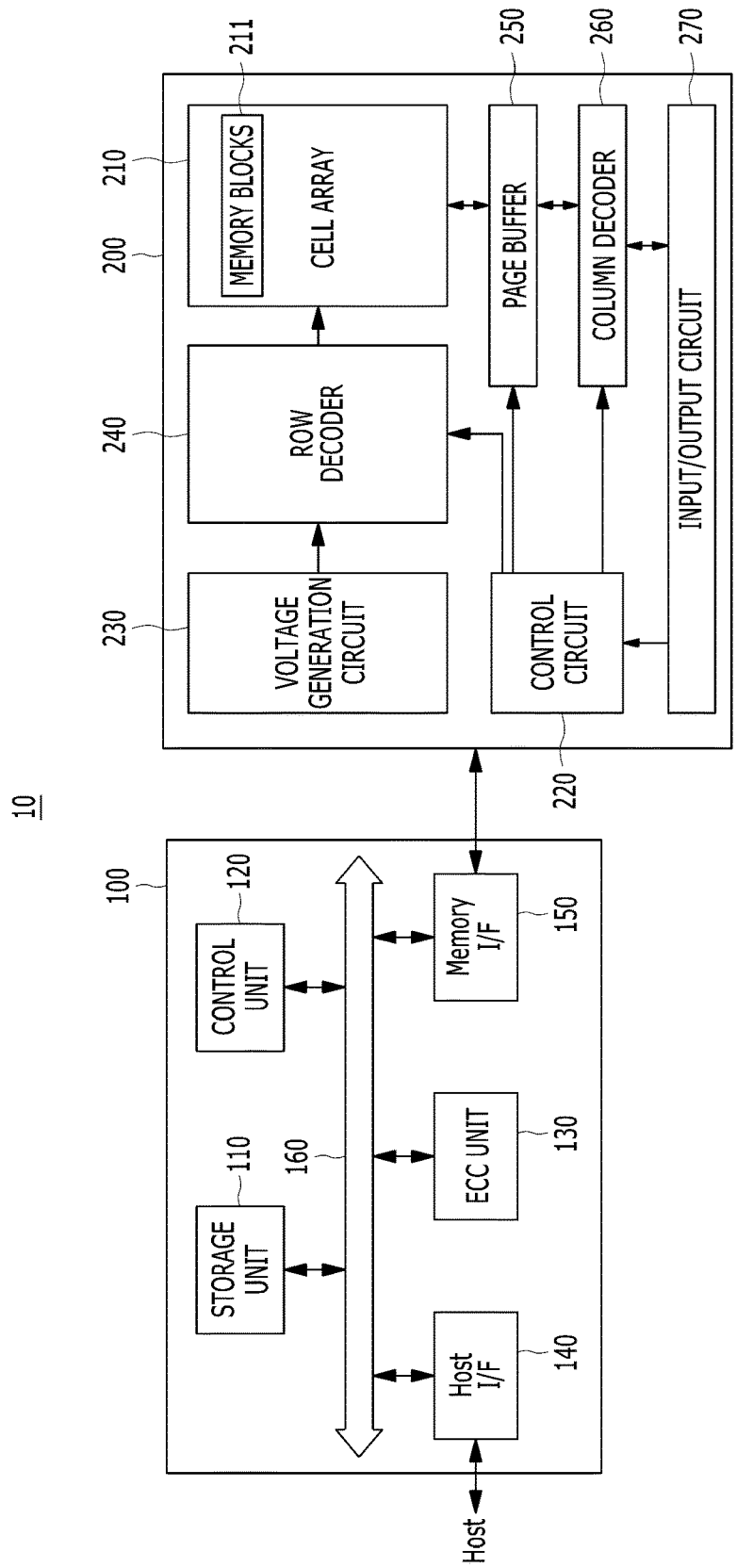
FIG. 2 is a detailed block diagram illustrating a semiconductor memory system in accordance with an embodiment of the present invention.

Referring now to FIG. 2, therein is shown a detailed block diagram illustrating a memory system in accordance with an embodiment of the present invention. For example, the memory system of FIG. 2 may depict the memory system shown in FIG. 1. The memory system may include the memory controller 100 and the semiconductor memory devices 200. The memory system may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The semiconductor memory devices 200 may store data to be accessed by the host device, and can be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory controller 100 may control storage of data in the semiconductor memory devices 200. For example, the memory controller 100 may control the semiconductor memory devices 200 in response to a request from the host device. The memory controller 100 may provide the data read from the semiconductor memory devices 200, to the host device, and store the data provided from the host device into the semiconductor memory devices 200.

The memory controller 100 may include a storage unit 110, a control unit 120, the error correction code (ECC) unit 130, a host interface 140 and a memory interface 150, which are coupled through a bus 160.

The storage unit 110 may serve as a working memory of the memory system and the memory controller 100, and store data for driving the memory system and the memory controller 100. When the memory controller 100 controls operations of the semiconductor memory devices 200, the storage unit 110 may store data used by the memory controller 100 and the semiconductor memory devices 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the semiconductor memory devices 200 for the read and write operations. To store the data, the storage unit 110 may include a program memory, a data memory, a write buffer, a read buffer, a map buffer, and so forth.

The control unit 120 may control general operations of the memory system, and a write operation or a read operation for the semiconductor memory devices 200, in response to a write request or a read request from the host device. The control unit 120 may drive firmware, which is referred to as a flash translation layer (FTL), to control the general operations of the memory system. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the semiconductor memory devices 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the semiconductor memory devices 200 to allow the memory controller 100 to control the semiconductor memory devices 200 in response to a request from the host device. The memory interface 150 may generate control signals for the semiconductor memory devices 200 and process data under the control of the CPU 120. When the semiconductor memory devices 200 is a flash memory such as a NAND flash memory, the memory interface 150 may generate control signals for the memory and process data under the control of the CPU 120.

The semiconductor memory devices 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may pre-charge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
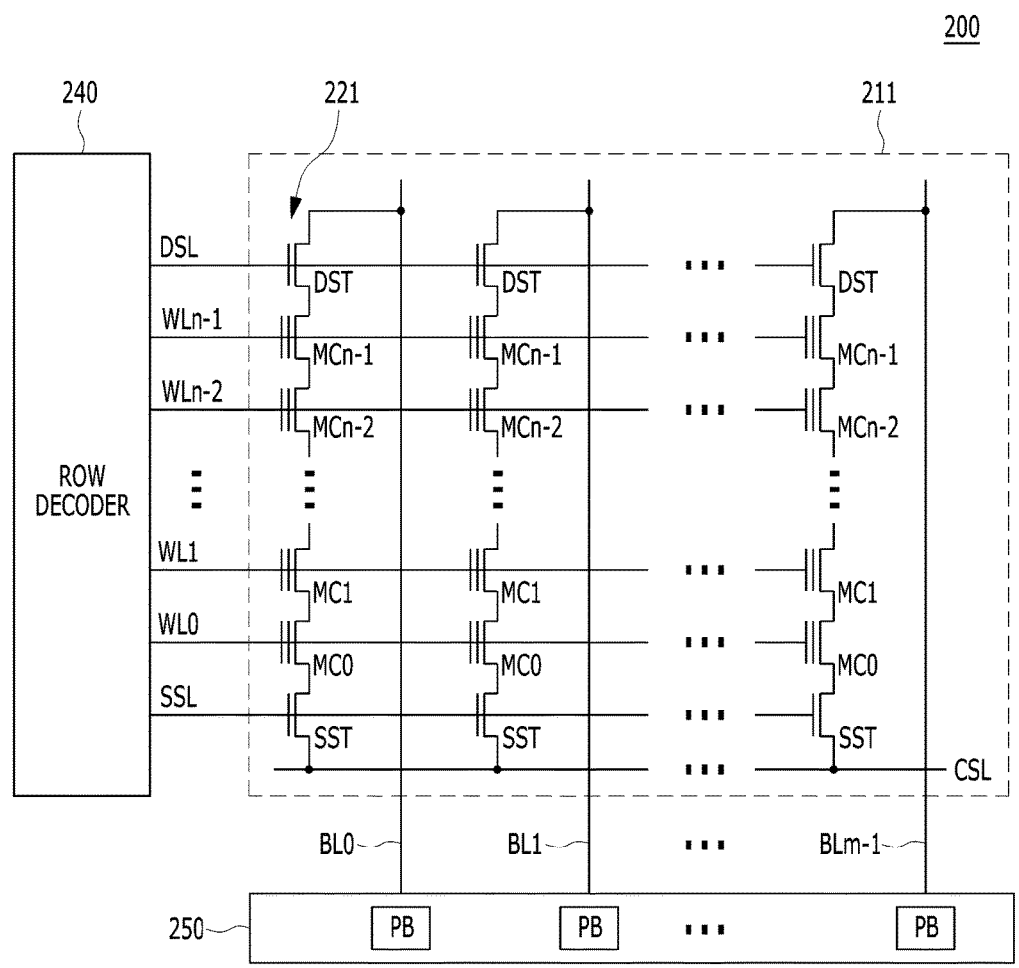
FIG. 3 is a circuit diagram illustrating a memory block of semiconductor memory devices in accordance with an embodiment of the present invention.

Referring now to FIG. 3, herein is shown a circuit diagram illustrating a memory block of semiconductor memory devices 200 in accordance with an embodiment of the present invention. For example, a memory block of FIG. 3 may be the memory blocks 211 of the memory cell array of the semiconductor memory devices 200 shown in FIG. 2.

The memory blocks 211 may include a plurality of cell strings 221 coupled to bit lines BL0 to BLm-1, respectively. The cell string of each column may include one or more drain selection transistors (DST) and one or more source selection transistors (SST). A plurality of memory cells or memory cell transistors may be serially coupled between the DSTs and SSTs. Each of the memory cells MC0 to MCn-1 may be formed of a multi-level cell (MLC) storing data information of multiple bits in each cell. The cell strings 221 may be electrically coupled to the corresponding bit lines BL0 to BLm-1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
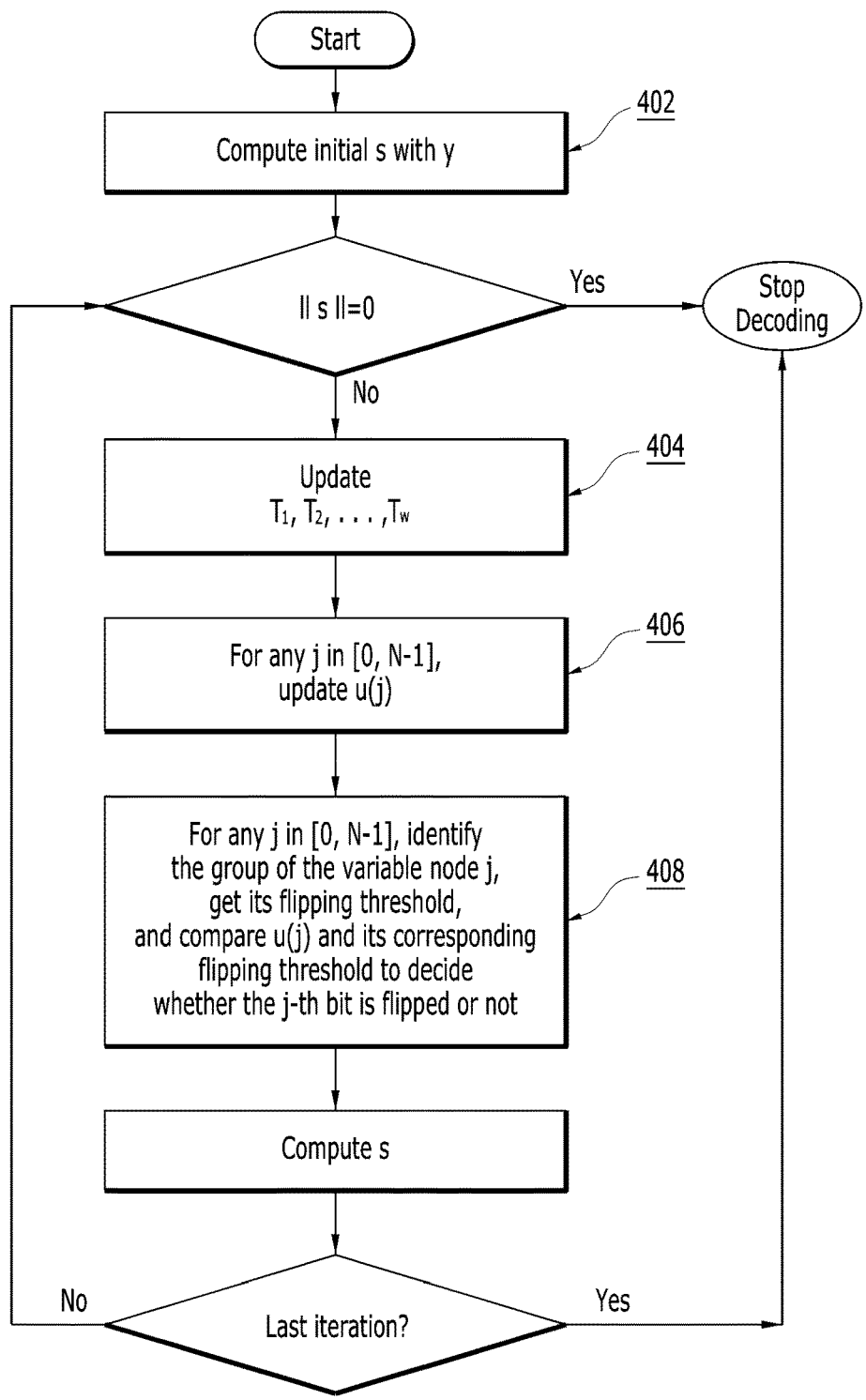
FIG. 4 is a block diagram illustrating flow of bit-flipping of irregular LDPC codes of semiconductor memory system in accordance with an embodiment of the present invention.

Referring now to FIG. 4, herein is shown a block diagram illustrating flow of bit-flipping of irregular LDPC codes of semiconductor memory system in accordance with an embodiment of the present invention. The embodiments of the present invention illustrate the apparatus and method thereof with an example of a parity-check matrix H, wherein the matrix H can be predetermined.

Given the M×N parity-check matrix H, the column weight of the i-th (0≤i<N) column of H is the number of non-zero entries in the i-th column of H. If column weights of all columns of H are the same, the LDPC code represented by H is called a regular LDPC code. If the column weights of all columns of H are not the same, the LDPC code is called an irregular LDPC code. In other words, the columns of the parity-check matrix H of the irregular LDPC code have different column weights.

There are many iterative decoding methods for LDPC codes, such as bit-flipping (BF) decoding algorithms, belief-propagation (BP) decoding algorithm, sum-product (SP) decoding algorithms, min-sum decoding algorithms, and Min-Max decoding algorithms. Among these methods, the BF decoding methods have the lowest computational and hardware complexity.

Usually in the BF decoding methods, there are two elements determining whether a variable node needs to be flipped or not. The first element is the flipping indicator of each variable node. Here, u(j) can represent the flipping indicator of the variable node j. The other element is a flipping threshold T. In each iteration, u(j) and T are calculated based on some rules. After getting the u(j) and T, whether the variable node j is flipped or not is based the relationship between the u(j) and T. For example, if u(j) is greater than T, the variable node j can be flipped. Otherwise, the variable node j is still the same as the decision of the previous iteration.

Regardless of the difference of the column weights of the parity matrix H, all the variable nodes adapt same rules to update the flipping threshold T. However, for the irregular LDPC codes, a uniform rule for updating the flipping threshold T for all the variable nodes may cause severe error correction performance loss.

The apparatus and operating method thereof proposed herein can use different rules for updating the flipping threshold T for the variable nodes with the different column weights or variable node degrees. First, the variable nodes can be divided into several groups based on the column weights or variable node degrees thereof. All the variable nodes in the same group have the same column weight or variable node degree. Each of the variable-node group can have own flipping threshold T rules thereof. Therefore, the decoder may need to maintain and update multiple flipping thresholds T.

Suppose that $x=[x_0, x_1, \ldots, x_{N-1}]$ is a bit vector, and $H=[h_{i,j}]$ is an M×N low-density parity-check matrix with a binary value $h_{i,j}$, such as 1 or 0, at the intersection of row i and column j.

$$H = \begin{bmatrix} h_{0,0} & \cdots & h_{0,n-1} \\ \vdots & h_{i,j} & \vdots \\ h_{m-1,0} & \cdots & h_{m-1,n-1} \end{bmatrix}$$

Wherein, i is in [0, M], and j is in [0, N].

Then each row of the LDPC matrix H can provide a parity check for the x vector. If x is a codeword of the LDPC matrix H, then $xH^T=0$. Assume that x is transmitted over a noisy channel, and the corrupted channel output is $y=[y_0, y_1, \ldots, y_{N-1}]$. The syndrome of y is a binary vector calculated by $$s=[s_0, s_1, \ldots, s_{M-1}]=yH^T, \qquad (1)$$

with a weight of $\|s\|$ which represents the number of unsatisfied check nodes. Wherein, $\|s_j\|$ denotes the number of unsatisfied check nodes associated with the variable node j. Assume the variable nodes can be divided into W groups, denoted as $G_1, G_2, \ldots, G_W$, wherein the flipping threshold T of each group can be represented as $T_1, T_2, \ldots, T_W$, respectively. All the variable nodes of each of the W groups has a same flipping threshold T, such that all the variable nodes of group $G_1$ associated with the flipping threshold $T_1$.

The proposed BF algorithm in the embodiments of the present invention can be an iterative algorithm. Per iteration, the proposed BF algorithm can update the flipping thresholds T for all groups, and correct errors by flipping multiple bits. One possible decoding flow of the proposed algorithm is shown in FIG. 4.

An initial syndrome s of iteration 1 can be calculated in accordance with the corrupted channel output y, following the above equation (1), in an initial step 402. The calculated initial syndrome s then can be evaluated whether the weight $\|s\|$ is zero. The number of unsatisfied check nodes is zero when the weight $\|s\|$ is zero, indicating no unsatisfied nodes and no error needs to be corrected. Then the decoding process can be completed and stopped. When the weight $\|s\|$ is not zero, the number of unsatisfied check nodes is not zero, the flipping threshold T of each group, such as $T_1, T_2, \ldots,$ and $T_W$, can be updated in a step 404, respectively.

In the step 404, the flipping threshold T of each group can be updated in accordance with various algorithms or rules. The embodiments of the present invention do not limit hereto.

After the flipping threshold T of each group is updated, the flipping indicator u(j) of the variable node j can be updated subsequently, wherein j is in [0, N−1]. Similar to the flipping threshold T, u(j) of the variable node j can be calculated in accordance with various algorithms or rules. The embodiments of the present invention do not limit hereto.

In subsequent step 408, the updated flipping indicator u(j) and flipping threshold T can be utilized to determine whether the j-th bit of the corrupted channel output y should be flipped or not. As described above, the variable nodes j can be divided into groups. For any j in [0, N−1], the group of the variable node j can be identified. The flipping threshold T associated with the group can also be identified, and u(j) can be calculated accordingly. The u(j) and the corresponding flipping threshold T then can be used to determine whether the j-th bit of the corrupted channel output y is flipped or not.

The syndrome s and the weight ||s|| then can be calculated and updated, and the updated weight ||s|| can be utilized to determine whether to end the decoding process. If the weight ||s|| is zero, indicating no unsatisfied nodes and no error needs to be corrected, or a max iteration number is reached, the iteration can be determined as the last iteration, and the decoding process can be completed and stopped. If the weight ||s|| is not zero, indicating that the unsatisfied nodes are existing and error correction is needed. The decoding process can be repeated in a subsequent iteration with the updated parameters.

It has been discovered that a semiconductor memory system and an operating method thereof provided in the embodiments of the present invention, can group variable nodes according to certain rules and performing error correction with group information individually. Conducting error correction according to corresponding group information can optimize ECC results, reduce power consumption, and improve overall memory system performance.

Figure 5:
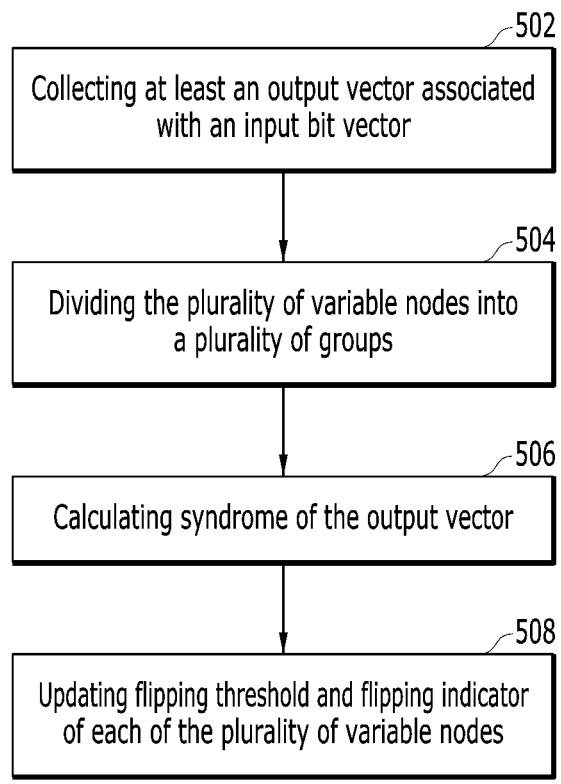
FIG. 5 is a flowchart illustrating an operating method of a semiconductor memory system in a further embodiment of the present invention.

FIG. 5 is a flowchart illustrating an operating method of a semiconductor memory system in a further embodiment of the present invention. The flowchart of operating method of a semiconductor memory system comprising: performing a decoding process including collecting at least an output vector associated with an input bit vector, wherein the input bit vector includes a plurality of variable nodes in a block of 502; dividing the plurality of variable nodes into a plurality of groups in a block of 504; calculating syndrome of the output vector in a block of 506; and updating flipping threshold and flipping indicator of each of the plurality of variable nodes in a block of 508.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of a foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A semiconductor memory system comprising:
a plurality of memory devices; and
a controller coupled with the memory devices and configured to perform a decoding process to
collect an output vector associated with an input bit vector, wherein the input bit vector corresponds to a plurality of variable nodes;
divide the plurality of variable nodes into a plurality of groups, each of which includes at least one variable node, among the plurality of variable nodes, based on column weight of each of the plurality of variable nodes;
calculate a syndrome of the output vector; and
update flipping thresholds and flipping indicators of the plurality of groups.

2. The system recited in claim 1 wherein the plurality of variable nodes is divided into the plurality of groups such that each variable node in a particular group, among the plurality of groups, has the same column weight.

3. The system recited in claim 1 wherein each of the plurality of groups has a designated flipping threshold.

4. The system recited in claim 1 wherein the flipping thresholds of different groups are updated at least in accordance with different rules associated with the different groups, respectively.

5. The system recited in claim 1 wherein the flipping indicators of different groups are updated at least in accordance with different rules associated with the different groups, respectively.

6. The system recited in claim 1 wherein the controller is further configured to identify a group to which a particular variable node of the plurality of variable nodes belongs.

7. The system recited in claim 6 wherein the controller is further configured to determine whether or not to flip the particular variable node at least in accordance with the flipping indicator and the flipping threshold associated with the group to which the particular variable node belongs.

8. The system recited in claim 1 wherein the decoding process is performed in iterations.

9. The system recited in claim 8 wherein the controller is further configured to determine whether to perform a subsequent iteration at least in accordance with a weight of the syndrome.

10. The system recited in claim 1 wherein the decoding process is performed in accordance with irregular LDPC codes.

11. An operating method of a semiconductor memory system comprising:
performing a decoding process including;
collecting an output vector associated with an input bit vector, wherein the input bit vector corresponds to a plurality of variable nodes;
dividing the plurality of variable nodes into a plurality of groups, each of which includes at least one variable node, among the plurality of variable nodes, based on column weight of each of the plurality of variable nodes;
calculating a syndrome of the output vector; and
updating flipping thresholds and flipping indicators of the plurality of groups.

12. The method recited in claim 11 wherein the dividing the plurality of variable nodes into a plurality of groups such that each variable node in a particular group, among the plurality of groups, has the same column weight.

13. The method recited in claim 11 wherein each of the plurality of groups has a designated flipping threshold.

14. The method recited in claim 11 wherein the updating flipping thresholds includes updating flipping thresholds at least in accordance with different rules associated with the different groups, respectively.

15. The method recited in claim 11 wherein the updating flipping indicators includes updating flipping indicators at least in accordance with different rules associated with the different groups, respectively.

16. The method recited in claim 11 further comprising:
identifying a group to which a particular variable node of the plurality of variable nodes belongs.

17. The method recited in claim 16 further comprising determining whether or not to flip the particular variable node at least in accordance with the flipping indicator and the flipping threshold associated with the group to which the variable node belongs.

18. The method recited in claim 11 wherein the performing the decoding process includes performing the decoding process in iterations.

19. The method recited in claim 18 further comprising:
determining whether to perform a subsequent iteration at least in accordance with a weight of the syndrome.

20. The method recited in claim 11 wherein the performing the decoding process includes performing the decoding process in accordance with irregular LDPC codes.

* * * * *